(12) United States Patent
Joo

(10) Patent No.: US 8,792,286 B2
(45) Date of Patent: Jul. 29, 2014

(54) SEMICONDUCTOR MEMORY DEVICE AND OPERATING METHOD THEREOF

(75) Inventor: Seok Jin Joo, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 226 days.

(21) Appl. No.: 13/331,013

(22) Filed: Dec. 20, 2011

(65) Prior Publication Data
US 2012/0155197 A1 Jun. 21, 2012

(30) Foreign Application Priority Data

Dec. 20, 2010 (KR) .................. 10-2010-0130512

(51) Int. Cl.
*G11C 7/00* (2006.01)
(52) U.S. Cl.
USPC .............. 365/189.05; 365/189.07; 365/230.08
(58) Field of Classification Search
USPC ................ 365/189.05, 189.07, 230.08
See application file for complete search history.

(56) References Cited

U.S. PATENT DOCUMENTS

| | | | | |
|---|---|---|---|---|
| 7,242,615 B2* | 7/2007 | Nagashima | ............. | 365/185.09 |
| 7,352,630 B2* | 4/2008 | Lee et al. | ................ | 365/185.22 |
| 7,590,027 B2* | 9/2009 | Makino | ...................... | 365/238.5 |
| 7,783,941 B2* | 8/2010 | Kim | ............................ | 714/711 |
| 7,830,720 B2* | 11/2010 | Lee et al. | ................ | 365/185.22 |
| 8,184,483 B2* | 5/2012 | Oh | ........................... | 365/185.19 |

FOREIGN PATENT DOCUMENTS

| | | | |
|---|---|---|---|
| KR | 1020090129205 A | | 12/2009 |
| KR | 1020100028195 A | | 3/2010 |

* cited by examiner

*Primary Examiner* — Pho M Luu
(74) *Attorney, Agent, or Firm* — William Park & Associates Patent Ltd.

(57) ABSTRACT

A semiconductor memory device includes a page buffer configured to store data read from a memory cell, a counter circuit configured to count the number of first data or second data in the read data for every read operation while the read operations are repeated a set number of times, and a control logic configured to determine the number of read operations and determine the read data of the memory cell based on the counted number.

17 Claims, 8 Drawing Sheets

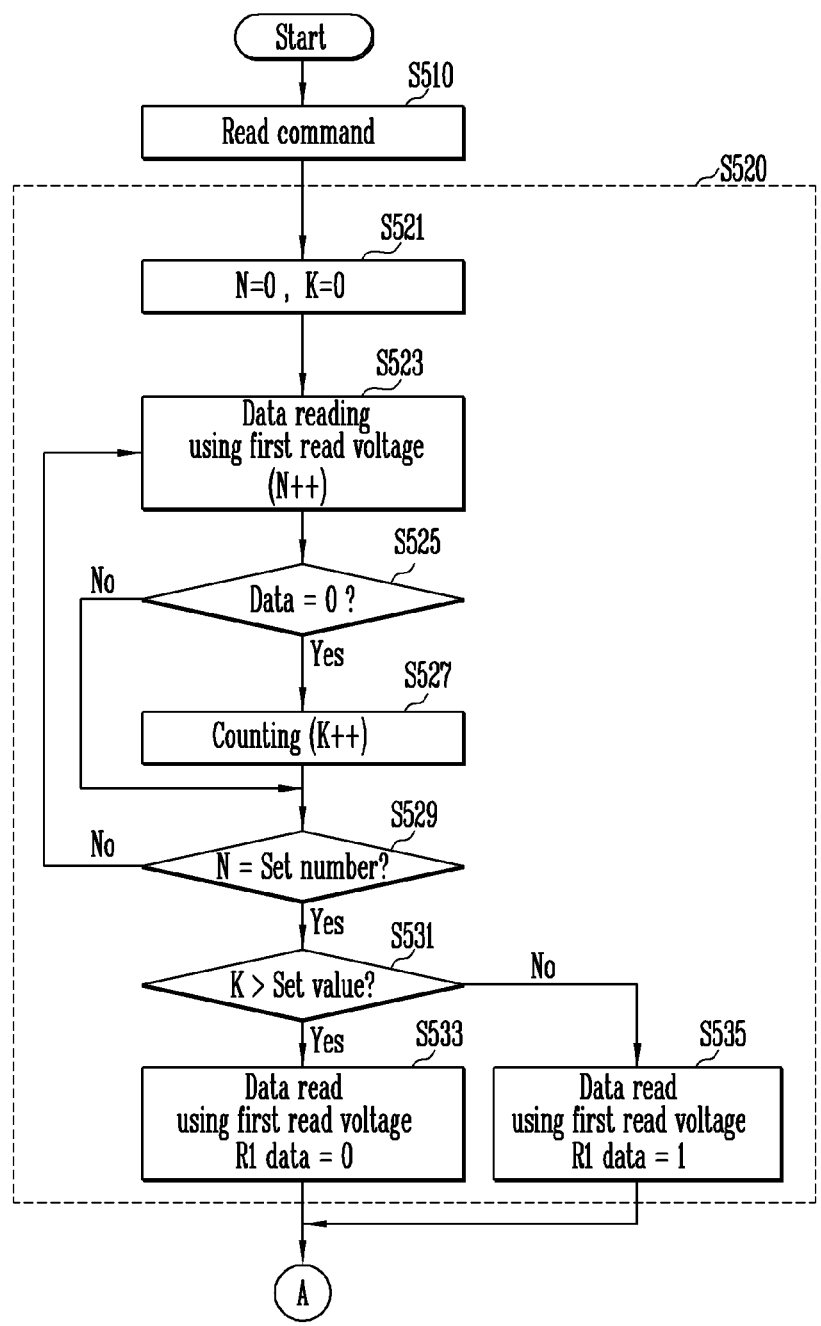

SEMICONDUCTOR MEMORY DEVICE AND OPERATING METHOD THEREOF

CROSS-REFERENCE TO RELATED APPLICATION

Priority is claimed to Korean patent application number 10-2010-0130512 filed on Dec. 20, 2010, the entire disclosure of which is incorporated herein by reference in its entirety.

BACKGROUND

Exemplary embodiments relate generally to an integrated circuit, and more particularly to a semiconductor memory device and an operating method thereof.

A nonvolatile memory device retains data stored therein even in absence of power supply. The nonvolatile memory device includes a flash memory device. The flash memory device may be divided into a NOR flash memory device and a NAND flash memory device according to the structure of a memory cell array. The gate of the flash memory cell includes, for example, a tunnel insulating layer, a floating gate, a dielectric layer, and a control gate.

In the case of the NAND flash memory device, a program operation and an erase operation are performed through F-N tunneling. In addition, the floating gate is accumulated with electrons by the program operation, and the electrons accumulated in the floating gate are discharged to a substrate by the erase operation. Furthermore, when a read operation is performed, the threshold voltage of a memory cell, shifted depending on the amount of electrons accumulated in the floating gate, is detected, and data is read on the basis of the detected threshold voltage.

In the operation of detecting the threshold voltage of the memory cell, a random telegraph noise (RTN) phenomenon may occur and thus the threshold voltage of the memory cell may vary according to whether electrons are trapped in or released from the floating gate of the memory cell. In other words, detected threshold voltage of a memory cell may vary even though data stored in the memory cell has not changed owing to the RTN phenomenon. The RTN phenomenon makes it difficult to narrow the width of a distribution of the threshold voltages of memory cells because the threshold voltages of the memory cells verified in a programming process are shifted.

BRIEF SUMMARY

Exemplary embodiments relate to a semiconductor memory device and an operating method thereof which are capable of narrowing a distribution of the threshold voltages of memory cells by repeatedly reading data from the same memory cell by a set number and determining the mean value of read data as data of the memory cell.

A semiconductor memory device according to an aspect of the present disclosure includes a page buffer configured to store data read from a memory cell, a counter circuit configured to count the number of first data or second data in the read data for every read operation while the read operations are repeated a set number of times, and a control logic configured to determine the number of read operations and determine the read data of the memory cell based on the counted number.

A data read method of a semiconductor memory device according to an aspect of the present disclosure includes repeating a read operation on a first memory cell a set number of times by using a first read voltage in response to a read command, counting the number of first data or second data in data read while the read operations are repeated, and determining the data, stored in the memory cell, based on the counted number of first or second data.

A data read method of a semiconductor memory device according to another aspect of the present disclosure includes repeating a read operation a set number of times using a first read voltage in order to read most significant bit (MSB) data stored in a memory cell, counting the number of first data or second data in read data for every read operation, and determining first read data based on the counted number of first data or second data.

BRIEF DESCRIPTION OF THE DRAWINGS

FIGS. 5A and 5B are flowcharts illustrating the read operation of the semiconductor memory device according to an embodiment of the present invention;

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
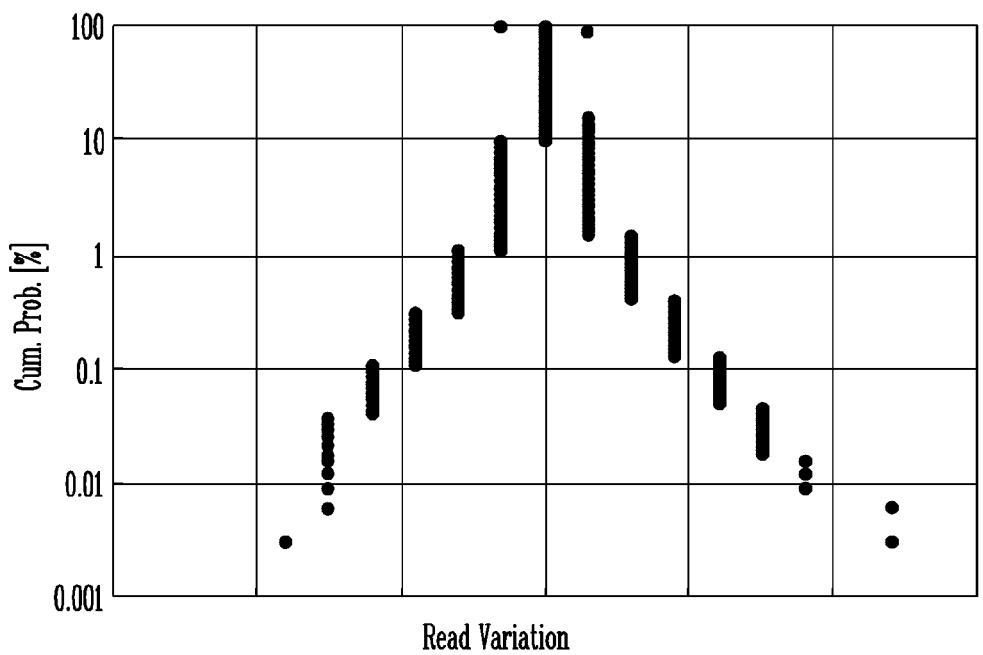
FIG. 1 shows a distribution of the threshold voltages of memory cells.
Figure 2:
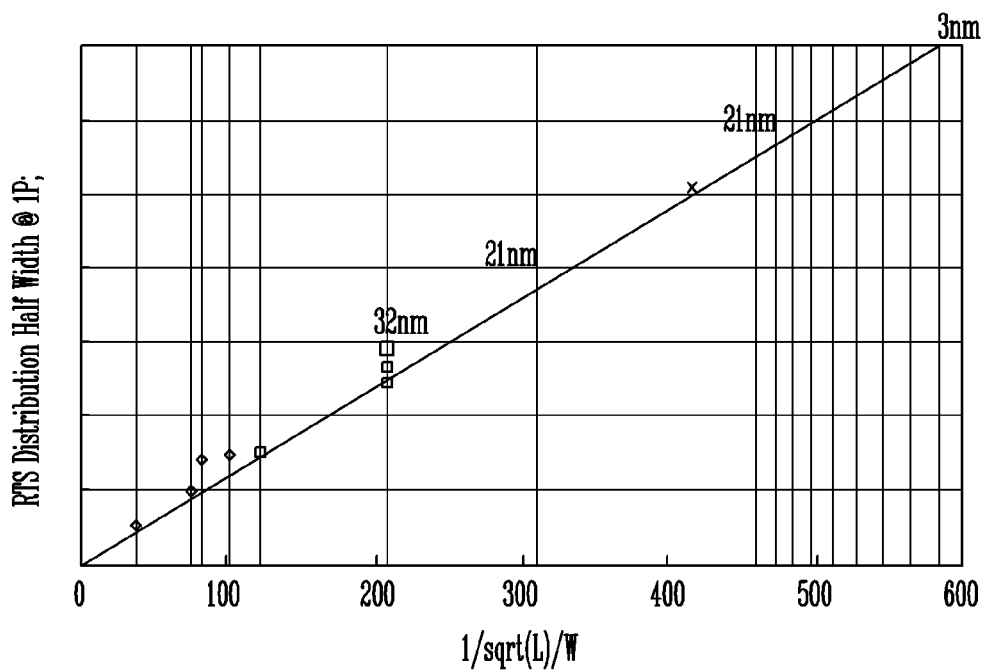
FIG. 2 shows an RTN phenomenon occurring according to the degree of integration of semiconductor memory devices.

FIG. 1 shows a distribution of the threshold voltages of memory cells, and FIG. 2 shows an RTN phenomenon occurring according to the degree of integration of semiconductor memory devices.

From FIG. 1, it can be seen that the threshold voltages of memory cells on which a program has been performed are widely distributed.

When the memory cells are programmed, a random telegraph noise (RTN) phenomenon in which the threshold voltages of the memory cells are shifted occurs, thereby widening a distribution of the threshold voltages. The RTN phenomenon can be explained from the fact that the threshold voltage of the memory cell may vary according to whether electrons are trapped in or released from the floating gate of the memory cell. The RTN phenomenon is becoming a source of concern in light of the ongoing effort to achieve more highly integrated and smaller sized semiconductor memory devices. As shown in FIG. 2, a probability of occurrence of the RTN phenomenon increases with an increase in the degree of integration.

Figure 3A:
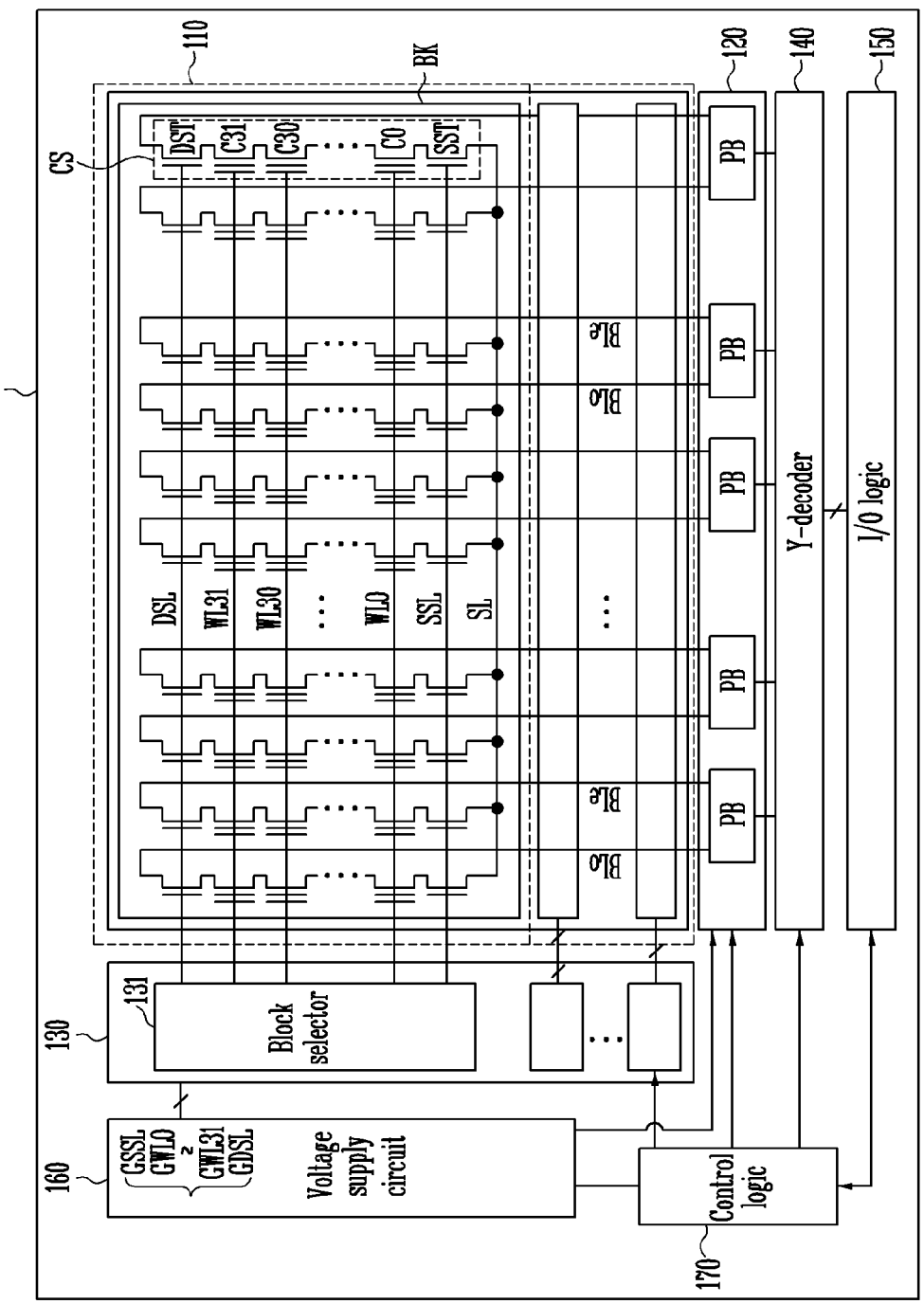
FIG. 3A shows a semiconductor memory device for illustrating an embodiment of the present invention.

FIG. 3A shows a semiconductor memory device for illustrating an embodiment of the present invention.

Referring to FIG. 3A, the semiconductor memory device 100 includes a memory cell array 110, a page buffer group 120, an X decoder 130, a Y decoder 140, an I/O logic 150, a voltage supply circuit 160, and a control logic 170.

The memory cell array 100 includes a plurality of memory blocks BK. Each of the memory blocks BK includes a plurality of cell strings CS.

Each of the cell strings CS includes, for example, $0^{th}$ to $31^{st}$ memory cells C0 to C31 coupled in series between a drain select transistor DST and a source select transistor SST.

The gate of the drain select transistor DST is coupled to a drain select line DSL, and the gate of the source select transistor SST is coupled to a source select line SSL.

The gates of the $0^{th}$ to $31^{st}$ memory cells C0 to C31 are coupled to $0^{th}$ to $31^{st}$ word lines WL0 to WL31, respectively.

The drains of the drain select transistors DST are coupled to respective bit lines. The bit lines may be divided into even bit lines BLe and odd bit lines BLo.

The sources of the source select transistors SST are coupled to a common source line SL in common.

Figure 3B:
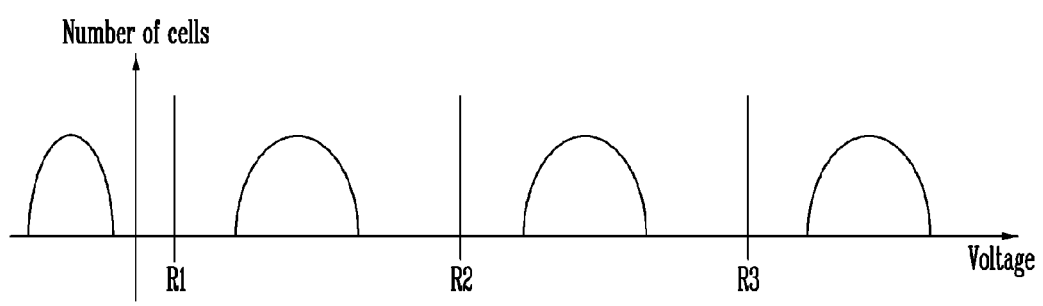
FIG. 3B shows distributions of the threshold voltages of memory cells of FIG. 3A when the memory cells are programmed.

FIG. 3B shows distributions of the threshold voltages of the memory cells of FIG. 3A when the memory cells are programmed.

Referring to FIG. 3B, the memory cells of FIG. 3A are Multi-Level Cells (MLC), and one of the threshold voltages of the memory cells may belong to one of four threshold voltage distributions (for example, 11, 01, 00, 10) through a programming process.

In the case of 2-bit MLC, data is programmed in a Least Significant Bit (LSB) logical page (1, 1, 0, 0) and a Most Significant Bit (MSB) logical page (1, 0, 0, 1). For example, data programmed in the LSB logical page is read using a second read voltage R2.

In addition, data programmed in the MSB logical page is read using first and third read voltages R1 and R3.

The page buffer group 120 includes a plurality of page buffers PB for a program or read operation.

Each of the page buffers PB is coupled to, for example, a pair of the even bit line BLe and the odd bit line BLo.

The Y decoder 140 provides an I/O path between the page buffer group 120 and the I/O logic 150 in response to a control signal generated from the control logic 170.

The I/O logic 150 performs data input and output from and to the outside.

The X decoder 130 includes a plurality of block selectors 131. The block selectors 131 are coupled to the respective memory blocks BK.

The block selector 131 couples the drain select line DSL and the global drain select line GDSL, couples the source select line SSL and the global source select line GSSL, and couples the $0^{th}$ to $31^{st}$ word lines WL0 to WL31 of the memory block BK, and the $0^{th}$ to $31^{st}$ global word lines GWL0 to GWL31, respectively, in response to the control signal of the control logic 170.

The voltage supply circuit 160 generates operating voltages in response to the control signal of the control logic 170 and supplies the operating voltages to the global lines GSSL, GDSL, and GWL0 to GWL31.

The control logic 170 generates control signals for controlling the operations of the page buffer group 120, the X decoder 130, the Y decoder 140, the I/O logic 150, and the voltage supply circuit 160 of the semiconductor memory device 100.

Figure 4:
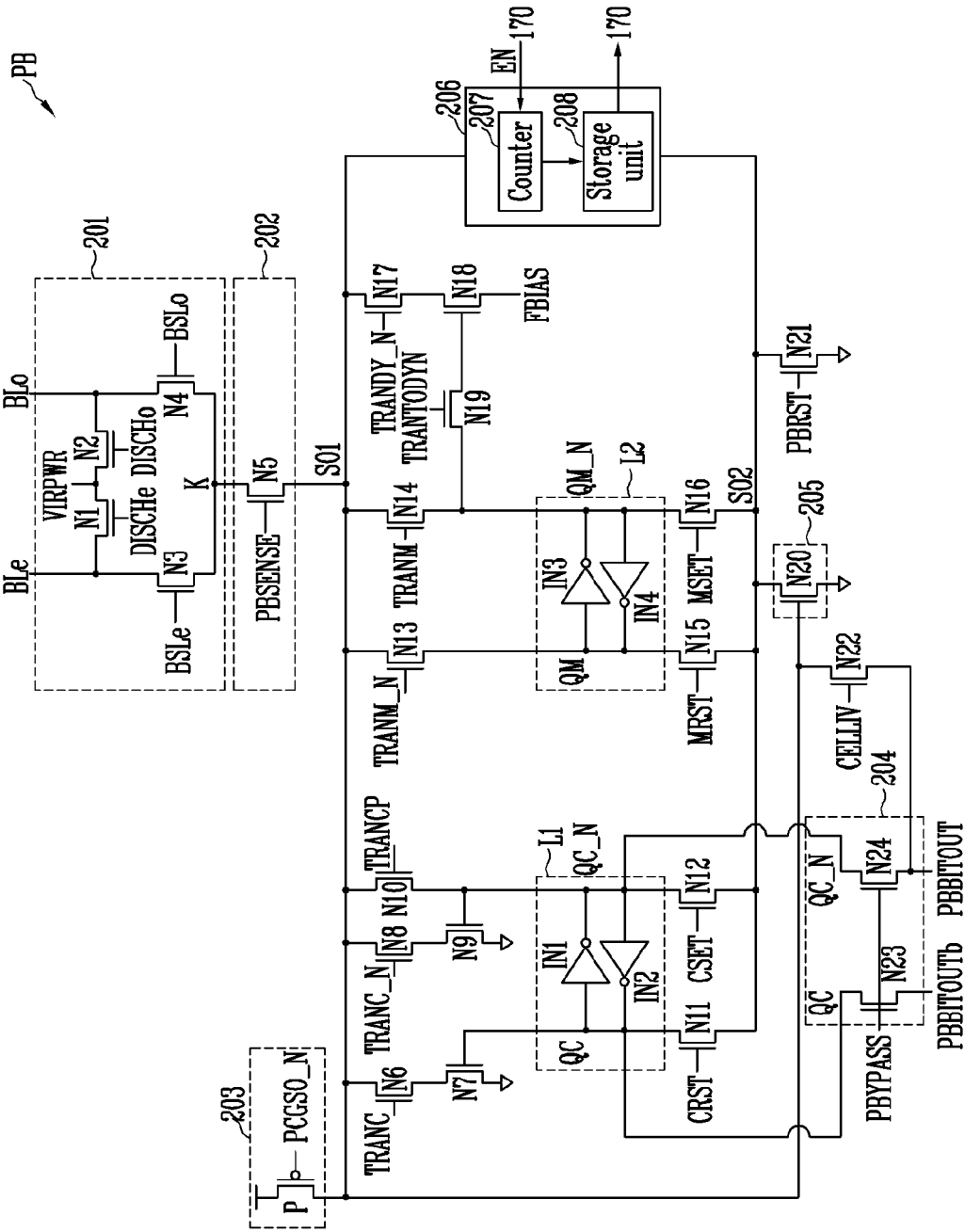
FIG. 4 shows a page buffer of FIG. 3A.

FIG. 4 shows the page buffer PB of FIG. 3A.

Referring to FIG. 4, the page buffer PB includes, for example, a bit line selection unit 201, first and second sense units 202 and 205, a precharge unit 203, a data I/O unit 204, a counter circuit 206, first and second latches L1 and L2, and transistors for data transmission, reset, and set.

More particularly, the bit line selection unit 201 selects one of the even bit line BLe and the odd bit line BLo and couples the selected bit line to a node K or precharges or discharges the even bit line BLe and the odd bit line BLo.

The bit line selection unit 201 may include first to fourth NMOS transistors N1 to N4.

The first and the second NMOS transistors N1 and N2 are coupled in series between the even bit line BLe and the odd bit line BLo. An even discharge signal DISCHe is inputted to the gate of the first NMOS transistor N1, and an odd discharge signal DISCHo is inputted to the gate of the second NMOS transistor N2.

A variable voltage VIRPWR is inputted to a node connecting the first and the second NMOS transistors N1 and N2. The variable voltage VIRPWR may become a power source voltage Vcc or a ground voltage Vss in order to precharge or discharge the bit lines.

The third NMOS transistor N3 is coupled between the even bit line BLe and the node K, and the fourth NMOS transistor N4 is coupled between the odd bit line BLo and the node K.

An even selection signal BLSe is inputted to the gate of the third NMOS transistor N3, and an odd selection signal BLSo is inputted to the gate of the fourth NMOS transistor N4.

The first sense unit 202 may include a fifth NMOS transistor N5 coupled between the node K and a first sense node SO1. The fifth NMOS transistor N5 of the first sense unit 202 is turned on or off according to a voltage of the bit line BLe or BLo, coupled to the node K, and voltage of a sense signal PBSENSE inputted to the fifth NMOS transistor N5. Accordingly, the voltage of the first sense node SO1 is determined according to the voltage of the bit line BLe or BLo coupled to the node K.

The precharge unit 203 precharges the first sense node SO1. The precharge unit 203 may include a PMOS transistor P. The PMOS transistor P is coupled between the first sense node SO1 and the input terminal of the power source voltage Vcc. A precharge signal PCGSO_N is inputted to the gate of the PMOS transistor P.

Each of the first and the second latches L1 and L2 includes first and second inverters IN1 and IN2 and third and fourth inverters IN3 and IN4, respectively.

The data I/O unit 204 includes $23^{rd}$ and $24^{th}$ NMOS transistors N23 and N24 that are coupled between respective data I/O lines PBBITOUTb and PBBITOUT and the respective nodes QC and QC_N of the first latch L1. The data I/O unit 204 couples the nodes QC and QC_N to the respective data I/O lines PBBITOUTb and PBBITOUT in response to a data input signal PBYPASS.

The second sense unit 205 couples a second sense node SO2 to a ground node according to a voltage of the first sense node SO1. The second sense unit 205 may include a $20^{th}$ NMOS transistor N20.

The $20^{th}$ NMOS transistor N20 is coupled between the second sense node SO2 and the ground node, and the gate of the $20^{th}$ NMOS transistor N20 is coupled to the first sense node SO1.

In order to couple the second sense node SO2 to the ground node in response to a page buffer reset signal PBRST, a $21^{st}$ NMOS transistor N21 is coupled to the second sense node SO2.

In addition, the page buffer PB further includes, for example, sixth to $19^{th}$ NMOS transistors N6 to N19 for resetting the first and the second latches L1 and L2 or transferring data, stored in the first and the second latches L1 and L2, to the first sense node SO1.

The sixth and the seventh NMOS transistors N6 and N7 are coupled in series between the first sense node SO1 and the ground node. A first data transfer signal TRANC is inputted to the gate of the sixth NMOS transistor N6, and a node QC is coupled to the seventh NMOS transistor N7.

The eighth and the ninth NMOS transistors N8 and N9 are coupled between the first sense node SO1 and the ground node. A first data transfer signal TRANC_N is inputted to the gate of the eighth NMOS transistor N8, and a node QC_N is coupled to the ninth NMOS transistor N9.

The tenth NMOS transistor N10 is coupled between the first sense node SO1 and the node QC_N, and a first program signal TRANCP is inputted to the gate of the tenth NMOS transistor N10.

The $11^{th}$ NMOS transistor N11 is coupled between the node QC and the second sense node SO2. The $12^{th}$ NMOS transistor N12 is coupled between the node QC_N and the second sense node SO2.

A first reset signal CRST is inputted to the gate of the $11^{th}$ NMOS transistor N11, and a first set signal CSET is inputted to the gate of the $12^{th}$ NMOS transistor N12.

The $13^{th}$ NMOS transistor N13 is coupled between the first sense node SO1 and a node QM, and a second data transfer signal TRANM_N is inputted to the gate of the $13^{th}$ NMOS transistor N13.

The $14^{th}$ NMOS transistor N14 is coupled between the first sense node SO1 and a node QM_N, and a second data transfer signal TRANM is inputted to the gate of the $14^{th}$ NMOS transistor N14.

The $15^{th}$ NMOS transistor N15 is coupled between the node QM and the second sense node SO2, and the $16^{th}$ NMOS transistor N16 is coupled between the node QM_N and the second sense node SO2.

A second reset signal MRST is inputted to the gate of the $15^{th}$ NMOS transistor N15, and a second set signal MSET is inputted to the gate of the $16^{th}$ NMOS transistor N16.

The $17^{th}$ and the $18^{th}$ NMOS transistors N17 and N18 are coupled in series between the first sense node SO1 and a control signal input terminal FBIAS. A third data transfer signal TRANDY_N is inputted to the gate of the $17^{th}$ NMOS transistor N17.

The $19^{th}$ NMOS transistor N19 is coupled between the node QM_N and the gate of the $18^{th}$ NMOS transistor N18. A fourth data transfer signal TRANTODYN is inputted to the gate of the $19^{th}$ NMOS transistor N19.

According to an example, the counter circuit 206 is coupled between the first and the second sense nodes SO1 and SO2. The counter circuit 206 may include a counter 207 and a storage unit 208.

Here, when an enable signal EN received from the control logic 170, if a signal received from the first sense node SO1 is '1', the counter 207 counts the number of data 0. The counter 207 continues to count the number of data 0 while a read operation is repeatedly performed on one page by using the same read voltage, and the number of the data 0 counted by the counter 207 is stored in the storage unit 208.

Here, when the voltage of the first sense node SO1 is at a high level, a signal of the first sense node SO1 corresponds to '1'. When the voltage of the first sense node SO1 is at a low level, the signal of the first sense node SO1 corresponds to '0'.

The page buffer PB may include a $22^{nd}$ transistor N22 for measuring the current of a memory cell. The $22^{nd}$ NMOS transistor N22 is coupled to the first sense node SO1 and one (e.g., PBBITOUT) of the data I/O lines. A cell current measurement signal CELLIV is inputted to the gate of the $22^{nd}$ NMOS transistor N22.

According to an embodiment of the present invention, the semiconductor memory device 100 comprising the counter 207, for example, coupled to the first and the second sense nodes SO1 and SO2 of the page buffer PB as described above performs a read operation as follows.

Figure 5B:
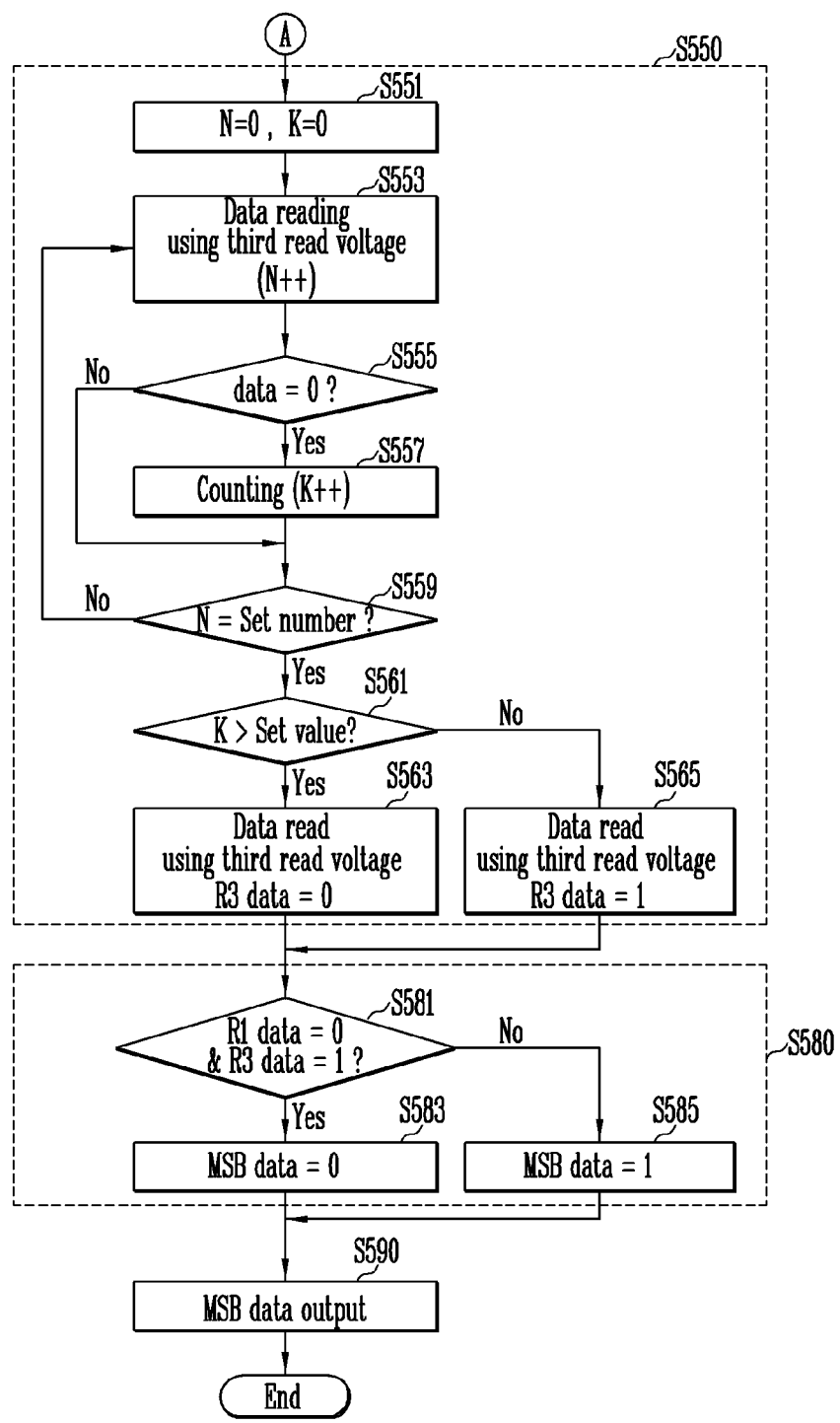

FIGS. 5A and 5B are flowcharts illustrating the read operation of the semiconductor memory device according to an embodiment of the present invention.

In FIGS. 5A and 5B, an example where a read operation of an LSB logical page is performed and then a read operation of an MSB logical page is performed is described with reference to FIGS. 3A, 3B, and 4. The LSB and MSB logical pages are already known in the program operation of an MLC, and a detailed description thereof is omitted. As described above with reference to FIG. 3B, in order to perform the read operation of the MSB logical page, the first and the third read voltages R1 and R3 may be used. The operations of FIGS. 5A and 5B focus on the operation of the page buffer PB.

Referring to FIGS. 3A to 5B, when a read command is received at step S510, the control logic 170 of the semiconductor memory device 100 performs a first read operation using the first read voltage R1 at step S520.

In the first read operation, parameters N and K for performing the read operation are set to '0' at step S521. The parameter N is a number of times that reading is repeated. The parameter K is used as a count value.

After the parameters are set, data is read using the first read voltage R1 at step S523. Here, the parameter N is raised by '1'. The read data is stored in the second latch L2 of the page buffer PB.

The data read at step S523 is determined on the basis of the threshold voltage of a selected memory cell coupled to the page buffer PB.

For example, when a memory cell has a threshold voltage higher than the first read voltage R1, data '0' is stored in the page buffer PB. When a memory cell has a threshold voltage lower than the first read voltage R1, data '1' is stored in the page buffer PB.

The data '0' and the data '1' are determined according to whether a threshold voltage is higher or lower than the first read voltage R1, but the definition of the data '0' and the data '1' may vary. In other words, the data '1' may be defined as a data corresponding to a threshold voltage higher than the first read voltage R1 and data '0' may be defined as a data corresponding to a threshold voltage lower than the first read voltage R1.

In various embodiments of the present invention, it is assumed that data '0' is stored when a memory cell has a threshold voltage higher than the first read voltage R1 and data '1' is stored when a memory cell has a threshold voltage lower than the first read voltage R1.

Next, in order to check whether the data stored in the second latch L2 of the page buffer PB is '0' or '1', the control logic 170 supplies the precharge signal PCGSO_N. This operation may be performed so as to count the number of data '0' or data '1'.

In response to the precharge signal PCGSO_N, the first sense node SO1 is precharged to '1'. Next, the control logic 170 supplies the third and the fourth data transfer signals TRANDY_N and TRANTODYN of a high level to the page buffer PB.

In response to the third and the fourth data transfer signals TRANDY_N and TRANTODYN, the $17^{th}$ and the $19^{th}$ NMOS transistors N17 and N19 are turned on. At this time, the control signal input terminal FBIAS is coupled to the ground node.

If the data stored in the second latch L2 is '1', the voltage of the node QM_N is '1', and thus the $18^{th}$ NMOS transistor N18 is turned on. Thus, the voltage of the first sense node SO1 is discharged through the $17^{th}$ and the $18^{th}$ NMOS transistors N17 and N18.

If the data stored in the second latch L2 is '0', the voltage of the node QM_N is '0', and the $18^{th}$ NMOS transistor N18 remains turned off. Thus, the voltage of the first sense node SO1 maintains '1'.

Next, the control logic 170 inputs the enable signal EN to the counter 207. In response to the enable signal EN, the counter 207 performs a counting operation according to a voltage of the first sense node SO1 at steps S525 and S527.

When the data stored in the second latch L1 is '1', the first sense node SO1 is discharged, and thus '0' of a low level is inputted to the counter 207. Thus, the counter 207 does not perform a counting operation.

If the data stored in the second latch L1 is '0', the counter 207 performs a counting operation because voltage '1' of a high level remains in the first sense node SO1.

That is, if the read data is data '0' and thus the voltage of the first sense node SO1 becomes '1', the counter 207 raises the parameter K from '0' to '1'. If the read data is '1' and thus the voltage of the first sense node SO1 becomes '0', the counter 207 does not perform a counting operation. The count value '1' is stored in the storage unit 208. The counter 207 updates a count value stored in the storage unit 208 whenever the count value is updated.

It is then checked whether the parameter N is equal to a set value at step S529.

If, as a result of the check, the parameter N is not equal to the set number, data is read using the first read voltage R1 and the parameter N is raised by '1' at step S523. Next, the number of data 0s is counted in the read data steps S525 to S527.

If, as a result of the check at step S529, the parameter N is equal to the set number, the repetitive read operation of a memory cell is stopped, and the control logic 170 checks whether the count value K stored in the storage unit 208 of the page buffer PB is greater than a set value at step S531. Here, the repetitive read operation may be performed by repeatedly reading data from the same memory cell using the same read voltage, and the set value may be a value N/2 when reading is repeated N times. Therefore, if the parameter K is greater than the set value, the number of data 0s read by the repetitive read operation exceeds 50%.

If, as a result of the check at step S531, the parameter K is greater than the set value, the data read from the memory cell coupled to the page buffer PB by using the first read voltage R1 is determined as '0' at step S533. If, as a result of the check at step S531, the parameter K is not greater than the set value, the data read from the memory cell coupled to the page buffer PB by using the first read voltage R1 is determined as '1' at step S535. The determined data is stored in the first latch L1. Next, the second latch L2 is reset.

Next, a read operation using the third read voltage R3 is performed like the read operation using the first read voltage R1. The read operation using the third read voltage R3 is described below with reference to step S550 of FIG. 5B.

Prior to the read operation using the third read voltage R3, the parameter N is reset to 0, and the parameter K is also reset to '0' at step S551.

Next, the read operation using the third read voltage R3 is performed, and the parameter N is raised by '1' at step S553.

The data read at step S553, as described above, is determined as '0' or '1' on the basis of the threshold voltage of a memory cell. The determined data is stored in the node QM of the second latch L2.

The data '0' is stored in the page buffer PB coupled to a memory cell having a threshold voltage higher than the third read voltage R3. The data '1' is stored in the page buffer PB coupled to a memory cell having a threshold voltage lower than the third read voltage R3.

Next, the counter 207 performs a counting operation according to a voltage of the first sense node SO1. For example, the counter 207 performs a counting operation if the data stored in the second latch L2 is '0' at steps S555 and S557.

For the counting operation, as in the case where data is read using the first read voltage R1 as described above, the first sense node SO1 is first precharged. Next, the $17^{th}$ and the $19^{th}$ NMOS transistors N17 and N19 are turned on in response to the third and the fourth data transfer signals TRANDY_N and TRANTODYN of a high level.

Accordingly, the voltage of the first sense node SO1 is changed on the basis of a state of the node QM_N of the second latch L2.

When the data '0' is read, the voltage of the first sense node SO1 maintains a high level because the state of the node QM_N is '1'. When the data '1' is read, the voltage of the first sense node SO1 maintains a low level because the state of the node QM_N is '0'.

Thus, when the data '0' is read (that is, when the voltage of the first sense node SO1 is at a high level), the counter 207 performs a counting operation.

As described above, data is repeatedly read until the parameter N is equal to a set number, and the counting operation is performed at steps S553 to S559.

Next, when the parameter K is greater than a set number at step S561, the data read using the third read voltage R3 is determined as '0' at step S563. If the parameter K is smaller than the set number at step S561, the data read using the third read voltage R3 is determined as '1' at step S565.

The determined data is stored in the second latch L2.

Each of the data read using the first and the third read voltages R1 and R3 is stored in the first and the second latches L1 and L2, respectively.

If the data, read using the first read voltage R1 and stored in the first latch L1, is '0' and the data, read using the third read voltage R3 and stored in the third latch L3, is '1' at step S581, '0' is determined as MSB data at step S583.

If the case of step S581 is not true, the MSB data is determined as '1' at step S585.

Finally, the determined MSB data is outputted at step S590.

In addition to the method of coupling the counter circuit 206 to the page buffer PB as in FIG. 4, only the latches of the page buffer PB may be used as the counter circuit 206.

As described above, the data read method of repeatedly reading data using the same read voltage and determining the mean value of the read data according to an embodiment of the present invention may compensate for an RTN phenomenon.

Figure 6:
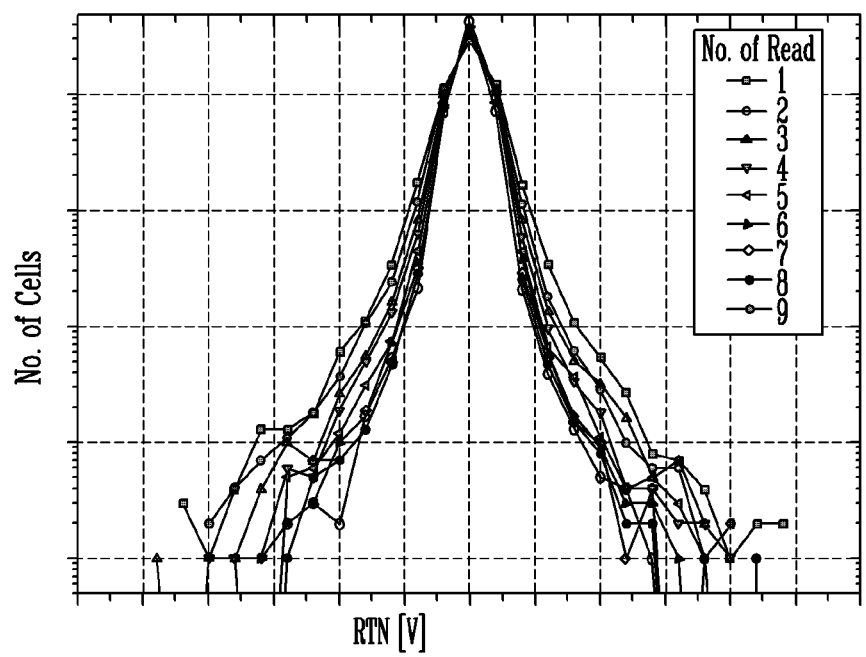
FIGS. 6 and 7 show an effect that RTN is compensated for according to the number of readings.
Figure 7:
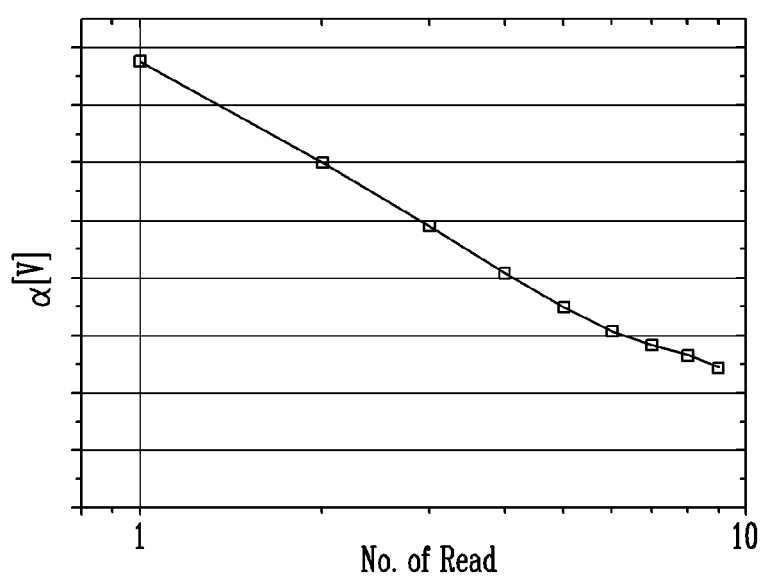

FIGS. 6 and 7 show that an effect due to the RTN phenomenon is reduced according to the number of readings.

From FIG. 6, it can be seen that a width of a distribution of the threshold voltages is narrowed according to an increase of the number of readings No. of Read.

From FIG. 7 showing the result of measurements, it can be seen that, if readings are repeated 10 times, a width of a distribution of the threshold voltages is reduced to ⅓ as compared with a case where reading is performed once.

In addition, the above method may also be applied to a semiconductor memory device having the page buffers PB each coupled to one bit line BL.

Figure 8:
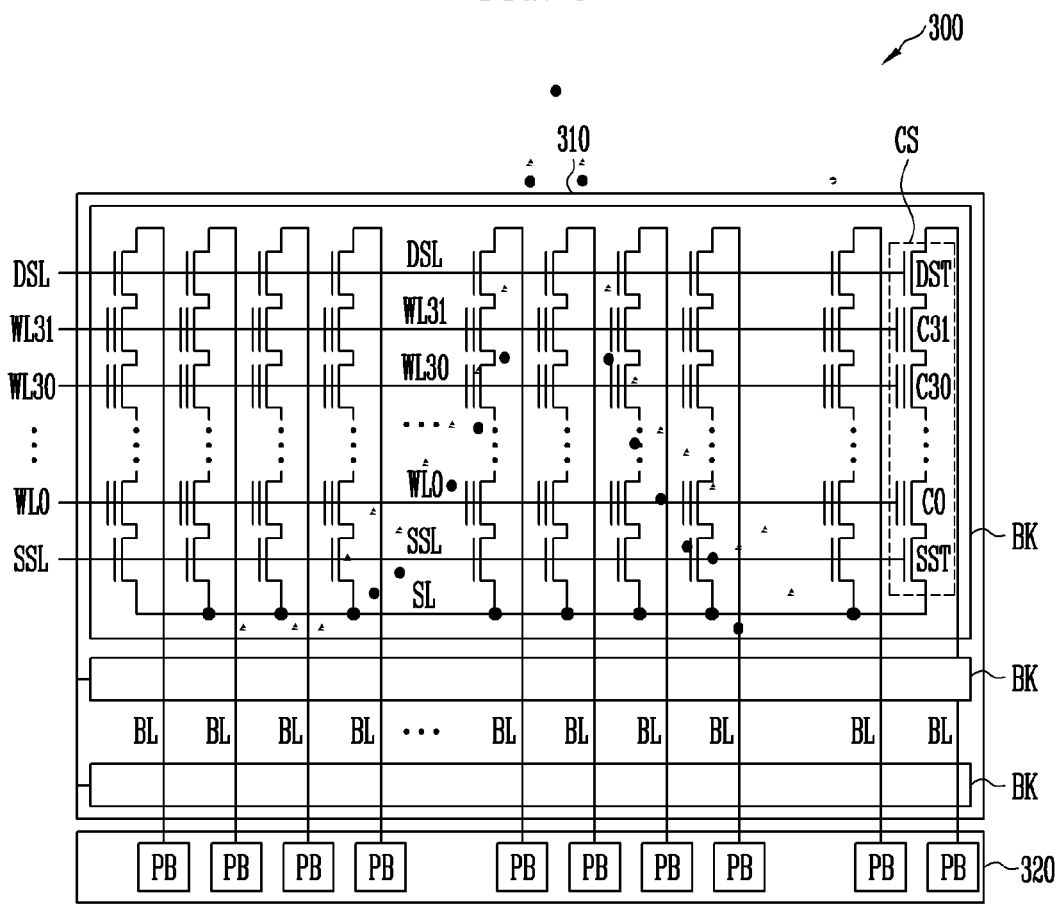
FIG. 8 shows part of a semiconductor memory device according to an embodiment of the present invention.

FIG. 8 shows a part of a semiconductor memory device according to an embodiment.

Referring to FIG. 8, only a memory cell array 310 and a page buffer group 320 are shown in the semiconductor memory device 300 according to an embodiment.

The memory cell array 310 may have the same structure as that of FIG. 3A except that each page buffer PB is coupled to only one bit line BL among many bit lines.

Therefore, the page buffer PB may have a similar configuration as the page buffer PB of FIG. 4. Here, the page buffer PB may be configured without a bit line selection unit for selecting even or odd bit line.

The above data read method may also be applied to the semiconductor memory device 300.

In the semiconductor memory devices and the operating methods thereof according to various embodiments of the present invention, data is repeatedly read from the same memory cell a set number of times, and the mean value of the read data is determined as data of the memory cell, thereby compensating for a random telegraph noise (RTN) phenomenon.

What is claimed is:

1. A semiconductor memory device, comprising:
   a page buffer configured to store data read from a memory cell;
   a counter circuit configured to count a number of first data or second data in the read data, output from the page buffer for each read operation, while the read operations on the memory cell using the same read voltage is repeated a set number of times; and
   a control logic configured to determine the number of read operations and determining the read data of the memory cell based on the counted number.

2. The semiconductor memory device of claim 1, wherein the control logic determines the read data of the memory cell as the first data, if the counted number of first data is greater than a set value.

3. The semiconductor memory device of claim 1, wherein the counter circuit comprises:
   a counter configured to count the number of first data or second data in response to an enable signal generated from the control logic; and
   a storage unit configured to store the counted number.

4. A data read method of a semiconductor memory device, comprising:
   repeating a read operation on a first memory cell a set number of times by using a first read voltage in response to a read command;
   counting a number of first data or second data in data read while the read operations are repeated; and
   determining the data, stored in the memory cell, based on the counted number of first or second data.

5. The data read method of claim 4, wherein determining the data stored in the memory cell comprises:
   if the number of first data is counted,
   comparing the counted number of first data with a preset value, and
   determining the data stored in the memory cell as the first data if the counted number of first data is greater than the preset value.

6. The data read method of claim 4, wherein determining the data stored in the memory cell comprises:
   if the number of second data is counted,
   comparing the counted number of second data with a preset value, and
   determining the data stored in the memory cell as the second data if the counted number of second data is greater than the preset value.

7. A data read method of a semiconductor memory device, comprising:
   repeating a read operation a set number of times using a first read voltage in order to read most significant bit (MSB) data stored in a memory cell;
   counting a number of first data or second data in read data for every read operation; and
   determining first read data based on the counted number of first data or second data.

8. The data read method of claim 7, further comprising:
   after determining the first read data,
   performing a read operation a set number of times using a second read voltage higher than the first read voltage;
   counting a number of first data or second data in read data for every read operation;
   determining second read data based on the counted number of first data or second data; and
   determining the MSB data based on a combination of the first and the second read data.

9. The data read method of claim 8, wherein determining the MSB data based on a combination of the first and the second read data comprises determining the MSB data as the first data, if the first read data is the first data and the second read data is the second data.

10. The data read method of claim 9, wherein determining the MSB data based on a combination of the first and the second read data comprises determining the MSB data as the second data, if the first read data is the first data and the second read data corresponds to data other than the second data.

11. The data read method of claim 8, further comprising:
   in order to read a least significant bit (LSB) data stored in the memory cell before reading the MSB data,
   repeating a read operation a set number of times using a third read voltage higher than the first read voltage, but lower than the second read voltage;
   counting a number of first data or second data in read data; and
   determining the LSB data based on the counted number of first data or second data.

12. The data read method of claim 11, wherein determining the LSB data based on the counted number of first data or second data comprises:
   if the number of first data is counted,
   comparing the counted number of first data with a preset value, and
   determining the LSB data as the first data if the counted number of first data is greater than the preset value.

13. The data read method of claim 12, wherein determining the LSB data based on the counted number of first data or second data comprises determining the LSB data as the second data if the counted number of first data is less than the preset value.

14. The data read method of claim 8, wherein determining second read data based on the counted number of first data or second data comprises:
   if the number of first data is counted,
   comparing the counted number of first data with a preset value, and
   determining the second read data as the first data if the counted number of first data is greater than the preset value.

15. The data read method of claim 14, wherein determining second read data based on the counted number of first data or second data comprises determining the second read data as the second data if the counted number of first data is less than the preset value.

16. The data read method of claim 7, wherein determining first read data based on the counted number of first data or second data comprises:
   if the number of first data is counted,
   comparing the counted number of first data with a preset value, and
   determining the first read data as the first data if the counted number of first data is greater than the preset value.

17. The data read method of claim 16, wherein determining first read data based on the counted number of first data or second data comprises determining the first read data as the second data if the counted number of first data is less than the preset value.

* * * * *